US006192496B1

(12) United States Patent
Lawrence et al.

(10) Patent No.: US 6,192,496 B1
(45) Date of Patent: *Feb. 20, 2001

(54) SYSTEM FOR VERIFYING SIGNAL TIMING ACCURACY ON A DIGITAL TESTING DEVICE

(75) Inventors: William R. Lawrence, Ft. Collins; David H. Armstrong, Boulder, both of CO (US)

(73) Assignee: Agilent Technologies, Inc., Palo Alto, CA (US)

( * ) Notice: Under 35 U.S.C. 154(b), the term of this patent shall be extended for 0 days.

This patent is subject to a terminal disclaimer.

(21) Appl. No.: 08/979,529

(22) Filed: Nov. 26, 1997

(51) Int. Cl.[7] ................................................ G01R 31/28
(52) U.S. Cl. ............................ 714/724; 324/73.1; 326/30
(58) Field of Search ........................ 714/724, 723, 714/725; 324/158.1, 73.1, 74, 130; 702/85, 107

(56) References Cited

U.S. PATENT DOCUMENTS

| 3,832,575 | * | 8/1974 | Dasgupta et al. | 324/73.1 |
| 4,994,732 | * | 2/1991 | Jeffrey et al. | 326/30 |
| 5,003,260 | * | 3/1991 | Auchterlonie | 324/207.16 |
| 5,083,083 | * | 1/1992 | El-Ayat et al. | 324/158 |
| 5,212,443 | * | 5/1993 | West et al. | 324/158 |
| 5,225,772 | | 7/1993 | Cheung et al. | 324/73.1 |
| 5,390,194 | | 2/1995 | Mannle | 714/744 |
| 5,471,145 | | 11/1995 | Mydill | 324/601 |
| 5,485,096 | | 1/1996 | Aksu | 324/761 |
| 5,504,432 | | 4/1996 | Chandler et al. | 324/537 |
| 5,590,136 | | 12/1996 | Firooz | 714/736 |
| 5,633,596 | | 5/1997 | Ilani | 324/754 |
| 6,025,708 | * | 2/2000 | Sticker | 324/158.1 |

* cited by examiner

Primary Examiner—Albert De Cady
Assistant Examiner—Guy Ramarre

(57) ABSTRACT

An apparatus and method are provided for testing component tolerances of a device for testing integrated circuits. The testing device is generally characterized by a plurality of test connectors disposed at a test head, wherein each test connector carries electrical signals for a test channel. Further, each test channel generally corresponds to a circuit board that includes at least one driver and one receiver. In this general type of tester, a system is provided that includes a specialized DUT board that establishes a low impedance electrical connection (i.e., short) between electrical conductors of a first and second test connector. Through this low impedance path, a first driver from a first circuit board is directly connected (i.e., shorted) to a first receiver on a second circuit board. A controller is configured to control the first driver to output an electrical signal at a predetermined time. The preferred embodiment further includes evaluating mechanism designed to detect the signal received at the first receiver, and timing mechanism configured to time the signal delay. Specifically, the timing mechanism is configured to determine the length of time required to propagate the signal from the driver to the receiver. In accordance with the method aspect, the method includes the step of establishing an electrical connection between electrical conductors of a first and second test connector such that a first driver from a first circuit board is electrically connected across a low impedance path to a first receiver on a second circuit board. The method then controls the output of the first driver to drive an edge of an electrical signal at a predetermined time and detecting the signal received at the first receiver. Finally, the method determines whether the signal received at the first receiver is within a predetermined time period of the predetermined signal level output from the first driver.

20 Claims, 9 Drawing Sheets

Microfiche Appendix Included
(1 Microfiche, 13 Pages)

DATE/TIME

SYSTEM FOR VERIFYING SIGNAL TIMING ACCURACY ON A DIGITAL TESTING DEVICE

MICROFICHE APPENDIX

This specification includes a microfiche appendix in compliance with 37 C.F.R. §1.96(c).

BACKGROUND OF THE INVENTION

1. Field of the Invention

The present invention generally relates to system for testing automatic testing machines, and more particularly to method and apparatus for testing the accuracy of signal timing on a digital testing device.

2. Discussion of the Related Art

A variety of automatic test equipment (ATE) have long been known for testing electronic circuits, devices, and other semiconductor and electronic products. Generally, automatic test equipment are divided into two broad categories, analog testers and digital testers. As the names imply, analog testers are generally designed for testing analog circuit devices, while digital testers are designed for testing digital circuit devices. Digital testers, as is known, generally include a testing device having a number of internal circuit cards or channels that generate programmably controlled test signals for testing and evaluating a Device Under Test (DUT). More specifically, ATE are programmably controlled to be adapted or configured to testing a variety of devices in a variety of ways. This is achieved by programming output signals to inject a certain signal (or signal transition) to a certain pin or signal line on a DUT. In this regard, a digital tester generally includes a test head whereby electrical signals are input to and output from the tester. The test head comprises a number of connectors, each defining a channel, which may be connected via cable or otherwise to a device under test. The electronics within the digital tester may then input and output signals to/from a DUT via the test head.

By way of an extremely simple illustration, consider a digital tester that is configured to test a wafer containing, among other things, a two input AND gate. The digital tester may be configured to apply a logic one on the two signal lines that correspond to the inputs of the AND gate, then receive the signal on the signal line corresponding to the output to ensure that it is driven to a logic one. The tester may then be configured to alternatively apply logic zero signals on each of the two signal lines corresponding to the AND gate inputs, in order to verify that the output of the AND gate transitions from a logic one to a logic zero in response. Although such a test will verify the functional operation of the AND gate, additional tests must be executed to verify timing and other aspects of the AND gate.

For example, assume that the two input signals to the AND gate are a logic one and a logic zero, the output is also a logic zero. When, however, the second input transitions from a logic zero to a logic one (whereby both inputs are at a logic one) then the output of the AND gate transitions from a logic zero to a logic one. Furthermore, the output must make this transition within a prescribed period of time, which time will be prescribed by manufacturer specifications. Accordingly, digital testers are further designed to allow programmed testing of such features by sensing and measuring the time between the transition of the input signal to the corresponding transition of the output signal. It will be appreciated that the example given above is an extremely simple example and is presented merely for purposes of illustration, and, as will be appreciated by those skilled in the art, digital testers are much more sophisticated and are capable of performing much more sophisticated and complex testing routines.

An extremely important aspect of ATE, including digital testers, is that the testing equipment maintain extremely accurate tolerances. Otherwise, it will not be clear whether measured values of a DUT reflect errors or discrepancies within the DUT, or whether errors or discrepancies result from component or other tolerance variations in the ATE components. In this regard, automatic test equipment manufacturers generally provide a set of built-in-test (BIT) routines for the automatic test equipment. However, and as will be further described below, these manufacturer provided BIT routines have proven to be generally inadequate in today's market of high-speed components and high volume manufacturing facilities.

Another way of verifying the accurate operation of a tester may be accomplished by using accurate, external testing equipment in a manual fashion. For example, volt meters may be used for testing voltage levels, and a oscilloscopes may be used for evaluating timing aspects. However, it will be appreciated that external testing of an ATE is extremely time consuming, and therefore adversely impacts production quantities. A particular problem that has been noted in recent years specifically relates to a digital tester's ability to self-test for timing accuracy. Indeed, the electronic devices today, which are often configured to operate at clock speeds in the hundreds of megahertz frequency range, must generally be maintained within tolerances on the order of hundreds of picoseconds. As a result, digital testers have generally proven unable to maintain the required accuracy through the manufacturer's test procedures provided with the equipment.

As a result of the general failure of testing devices in this respect, circuit designers have been known to write circuits tests for specific testers. That is, a circuit designer may design an electronic circuit test to pass the testing requirements of a given automatic tester, while failing those same tests on another digital tester of the same type. Charts, sometimes called white boards, have been generated that keep track of certain characteristics of various automatic testing equipment. Circuit designers have used the information contained within these white boards in order to design circuits to pass the test of a given tester. Clearly, however, this approach adversely affects the overall yield of a designed product, and is disfavored.

Accordingly, there is a need to develop a system for improving the accuracy of automatic testing equipment, specifically digital testers, by verifying with a high degree of accuracy the performance of the digital testers.

SUMMARY OF THE INVENTION

Certain objects, advantages and novel features of the invention will be set forth in part in the description that follows and in part will become apparent to those skilled in the art upon examination of the following or may be learned with the practice of the invention. The objects and advantages of the invention may be realized and obtained by means of the instrumentalities and combinations particularly pointed out in the appended claims.

To achieve the advantages and novel features, the present invention is generally directed to a system and method for testing component tolerances of a device for testing integrated circuits, the device having a plurality of test connectors disposed at a test head, each test connector having electrical conductors carrying electrical signals for a test channel, wherein each test channel corresponds to a circuit board that includes at least one driver and one receiver. In accordance with the broad concepts and teachings of the invention, an apparatus and method operate to compare driver and receiver components by interconnecting drivers from a first board to receivers of a second board, and vice-versa. Since built in test procedures provided by the tester manufacturer typically calibrate the drivers and receivers of a single pin, using cables and relays to hook that single pin to all other pins in the system, one at a time. Accordingly, the cross-check provided by the present invention provides a much improved system and method for verifying the accuracy of the operation of tester components.

In accordance with one aspect of the invention, an apparatus is provided for testing component tolerance of a device for testing integrated circuits. The testing device is generally characterized by a plurality of test connectors disposed at a test head, wherein each test connector carries electrical signals for a test channel. Further, each test channel generally corresponds to a circuit board that includes at least one driver and one receiver. In this general type of tester, a system is provided that includes a specialized DUT board (or other shorting means) that establishes a low impedance electrical connection between the one signal pin to a second signal pin on a different broad. All electrical connections are of substantially identical electrical length. Through this low impedance path, a first driver from a first circuit board is directly connected (i.e., shorted) to a first receiver on a second circuit board. A controller is configured to control the first driver to output an electrical signal at a predetermined time. Preferably, this signal may be generated at a first edge. As is known, driver signals may be generated at any of a number of edges. In the HP83000 tester (which is just one of many that may incorporate the concepts and teachings of the present invention), there are six edges within a single tester cycle. The preferred embodiment further includes evaluating means designed to detect the signal received at the first receiver, and timing means configured to time the signal delay. Specifically, the timing means is configured to determine the length of time required to propagate the signal from the driver to the receiver.

Consistent with the basic elements recited above, the preferred embodiment of the invention may be specially configured test various timing parameter of the tester hardware. For example, the system may be configured to test the rise time of a driver signal, to ensure that the rise time is within specification limits. Also, the specialized DUT board may be removed from the test head, so that each connector pin is disposed as an open circuit. This no-load condition results in maximum impedance mismatch within the line, and therefore maximizes the signal reflection back toward the driver. The receiver (companion receiver to the driver) may be configured to sense this reflection, and therefore determines the timing of the signal (and therefore cable length) between the driver and the connector PINS in a TDR test (time domain reflectometer measurement).

In accordance with another aspect of the present invention, a method is provided for measuring component timing variances in a testing device, such as that of the general configuration described above. In accordance with this aspect of the invention, the method includes the step of establishing an electrical connection between electrical conductors of a first and second signal pins such that a first driver from a first circuit board is electrically connected across a low impedance path to a first receiver on a second circuit board. The method then controls the output of the first driver to drive an edge of an electrical signal at a predetermined time and detecting the signal received at the first receiver. Finally, the method determines whether the signal received at the first receiver is within a predetermined time period of the predetermined signal level output from the first driver.

In accordance with a more specific aspect of the invention, the preferred embodiment may be provided on a computer readable storage medium containing program code for controlling the operation of a self test for an automatic testing device. The computer readable storage medium (which could be an integrated circuit, a magnetic disk, a CD ROM, etc.) includes: (1) a first code segment that contains program code that controls the output of a first driver on a first circuit board to drive an electrical signal to a predetermined value; (2) a second code segment that contains program code that evaluates the time the signal is received at a first receiver disposed on a second circuit board, that is configured to receive the signal output by the first driver; and (3) a third code segment that contains program code that verifies that the signal timing (the length of time for the signal to travel from the driver to the receiver through the DUT board) is within a predetermined tolerance of the predetermined signal, accounting for both driver and receiver error of the first driver and first receiver.

In accordance with yet another embodiment of the invention, a method for testing the tolerance of components within an automatic testing device is provided, and includes the step of disposing a first test connector in an open, no-load configuration to obtain maximum impedance mismatch from a characteristic line impedance and thus obtain maximum signal reflection. The, a first driver is controlled to drive an output signal at a predetermined time. The method then detects a reflected signal at a first receiver, wherein the first receiver is disposed on the same circuit board as the first driver. Finally, the method verifies that the signal received at the first receiver is received within a predetermined time of the signal output from the first driver.

DESCRIPTION OF THE DRAWINGS

The accompanying drawings incorporated in and forming a part of the specification, illustrate several aspects of the present invention, and together with the description serve to explain the principles of the invention. In the drawings.

DETAILED DESCRIPTION OF THE PREFERRED EMBODIMENT

Figure 1:
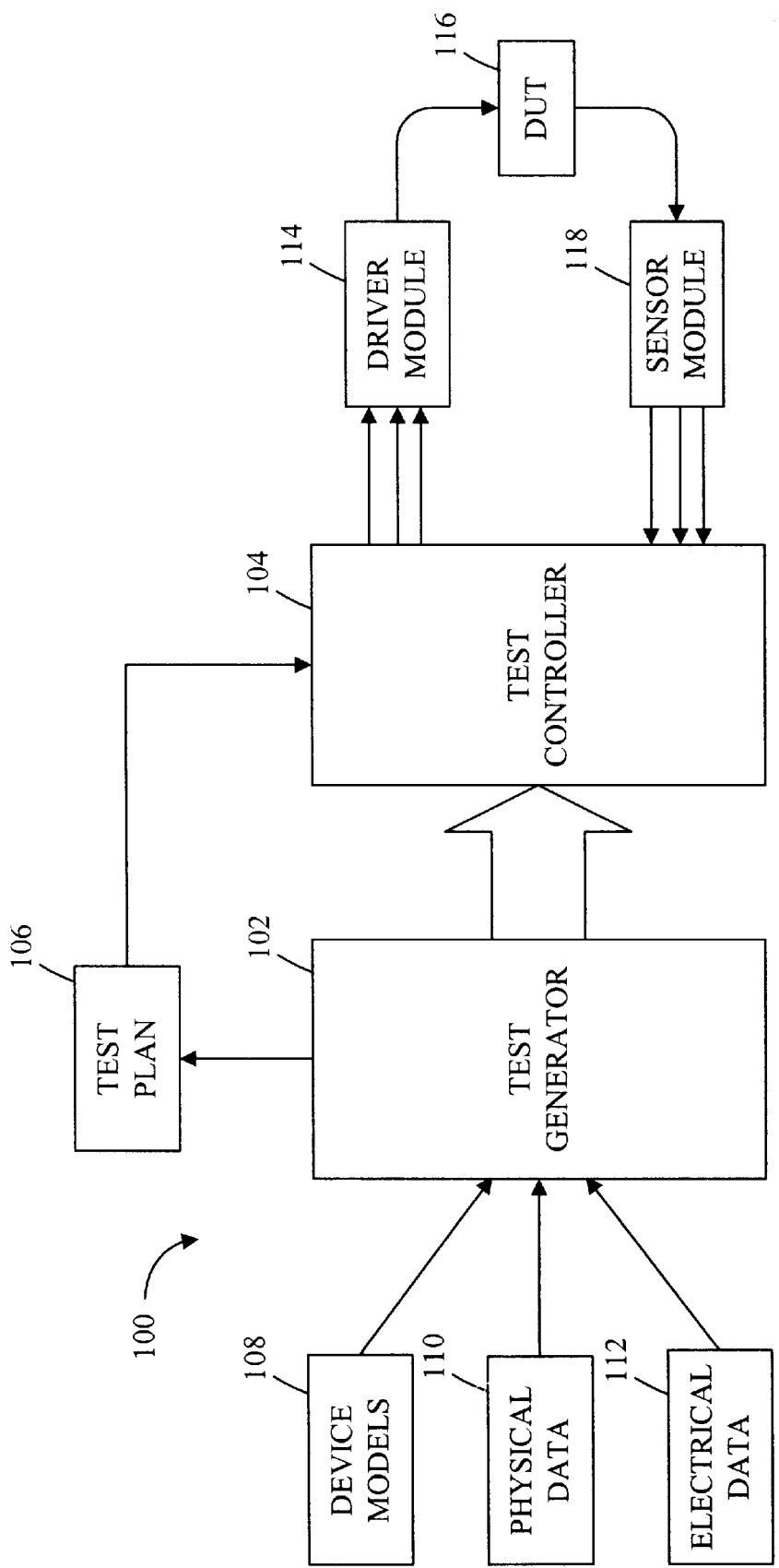
FIG. 1 is a block diagram of an automated testing device for testing digital electronic circuitry.

Having summarized various aspects of the present invention, reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications and equivalents included within the spirit and scope of the invention as defined by the appended claims.

Referring now to FIG. 1, a block diagram of a "board-type" ATE system (tester) 100 is shown. Although the preferred embodiment of the present invention is directed to wafer testers, the concepts and teachings are not so narrowly limited. Accordingly, FIG. 1 is shown merely to illustrate a prior art platform to which the concepts and teachings of the present invention may be applied. ATE system 100 includes a test generator 102 and a test controller 104. Test generator 102 generates an in-circuit test for each device on a board to be tested. A generic test plan 106 provides supervisory control over testing. This includes sequencing the tests, logging the results, controlling board/fixture interfacing, controlling the test power supplies, and providing a user interface. The combination of the individual in-circuit tests and test plan 106 forms a test specification.

A device models library 108, physical database 110, and an electrical database 112 may provide the data required for test generator 102 to generate the in-circuit tests. Electrical database 112 may contain a list of the devices on the DUT board 116, an electrical description for each device, and electrical interconnect information. Physical database 110 may contain a topological description of the board which may be used by test controller 104 to locate and test DUT 116. Physical database 110 and electrical database 112 are typically generated by a CAD/CAM (Computer Aided Design/Computer Aided Manufacturing) system during design of a board.

Device models library 108 contains a plurality of pregenerated generic models for commonly used digital integrated circuit chips (ICs). Essentially, each model is a test routine which is to be inserted (i.e., edited) into the board test specification. Each device model may provide, for a specific device, pin-out information (i.e., which pins are inputs, outputs, bidirectional, or unused), a test program, a method for pre-conditioning (described below) each output of the device, and device specific information including a test pattern rate and required signal levels.

Test controller 104 executes the in-circuit tests generated by test generator 102. A driver module 114 is used to apply the test signals to a DUT 116, and a sensor (receiver) module 118 is used to receive the response of DUT 116 to the test signals. The combination of driver module 114 and sensor module 118 is known as a tester channel. The HP83000 tester is an example of an ATE system, and is available from Hewlett-Packard Company.

Figure 2:
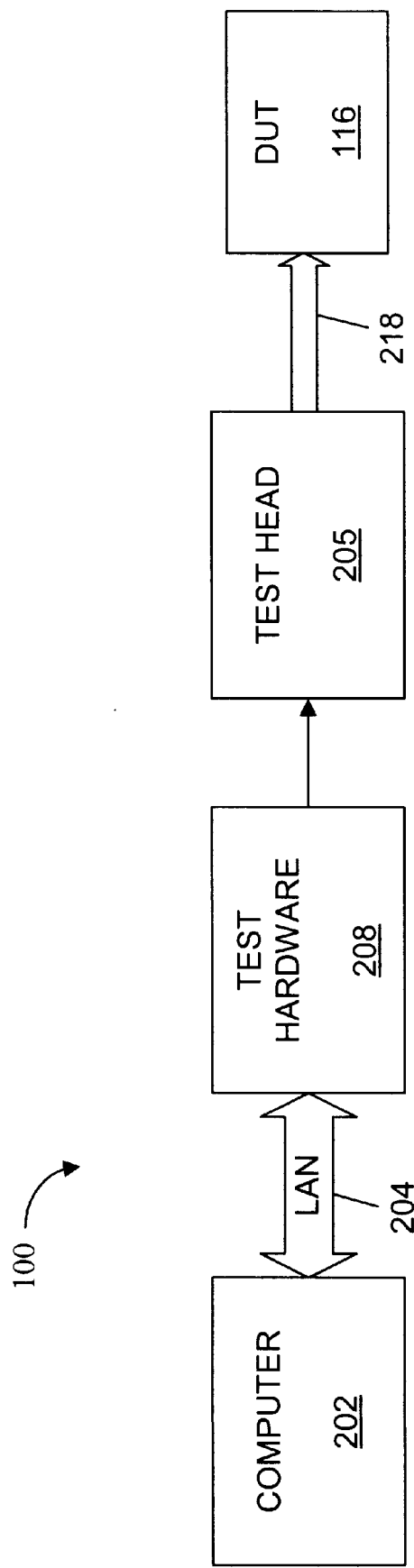
FIG. 2 is a block diagram illustrating an automated testing device.

Reference is now made to FIG. 2, which illustrates an environment in which the tester 100 may operate. A host computer 202 running an application program may be coupled to test hardware 208. In one embodiment, host computer 202 may be coupled to the test hardware 208 via a Local Area Network (LAN) 204. The test hardware 208 typically includes a test head 205 which provides the interface input and output to a DUT 116. The test hardware 208 may include analog devices, such as analog drivers and receivers, which can be used to perform analog testing on the DUT 116. An application program in the host computer 202 may communicate with an interpreter which performs Dynamic Link Library (DLL) calls which instruct remote test head 205 to perform a particular function. The test hardware 208 may receive instructions from the host computer 202. These instructions may then control the various tests that are run on DUT 116.

Figure 3:
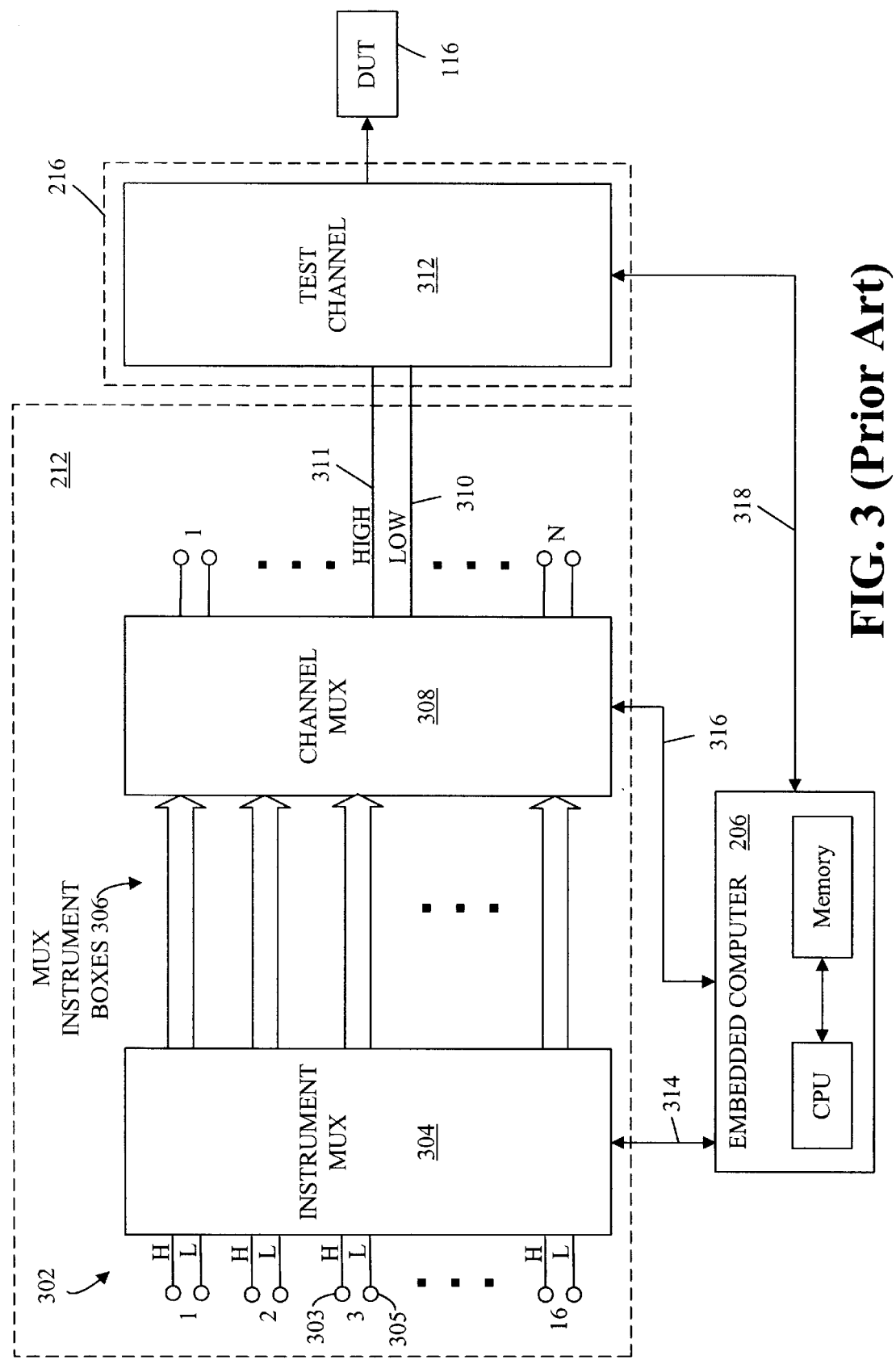
FIG. 3 is a more detailed view of a test head of an automated testing device.

FIG. 3 illustrates the test hardware 208 in greater detail. In one embodiment, sixteen instrument ports, 302, each comprising a high line 303 and a low line 305, are input into an instrument MUX 304. The instrument MUX 304 outputs signals on four instrument buses 306. The embedded computer 206 instructs the instrument MUX 304 via control line 314 as to which instrument signals should be placed on the instrument buses 306. Instrument buses 306 are then multiplexed to a plurality of channels via channel MUX 308.

The embedded computer 206 controls which signals are output from channel MUX 308 via control line 316. The channel MUX 308 outputs comprise DUT high lines 311 and DUT low lines 310. These high and low lines are generated by an instrument 308. The high and low lines are used as inputs into the test channel 312, which is shown in greater detail in FIG. 4, during testing. When testing a particular circuit board, that is a DUT, the number of channels utilized by the embedded computer 206 is generally equal to the number of nodes to be tested on the circuit board.

Figure 4:
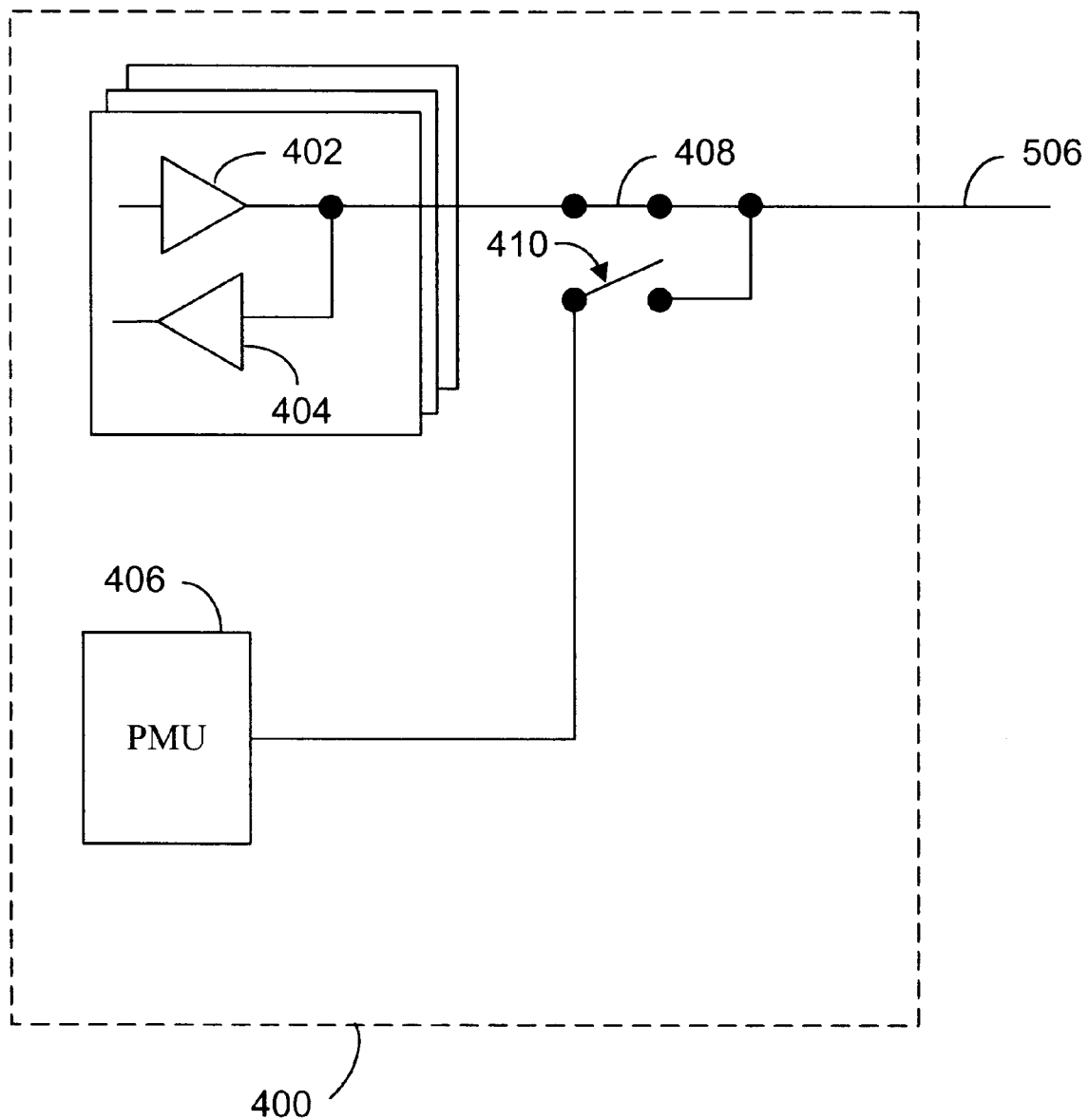
FIG. 4 is a block diagram illustrating principal components of a circuit board containing a plurality of drivers and receivers in a testing device.

Having described, generally, the architecture and environment that is common to many testers, reference is now made to FIG. 4, which is a block diagram of certain components of a circuit board 400 of an HP83000 tester, which is the preferred platform tester for the preferred embodiment of the present invention was designed. As illustrated, the circuit board 400 includes a plurality of drivers 402 and receivers 404. As is known, the drivers 402 are configured to output signals to pins of a test connector. On the HP83000, there are sixteen drivers and sixteen receivers on a single board/channel. A single parametric measurement unit PMU 406, however, is provided on the board 400. As is known, the PMU 406 is configured to quantify or measure signals. In operation, the PMU 406 provides calibration for the drivers 402 and receivers 404.

A number of relays are also illustrated in the drawing, and together provide for a dynamic board configuration. Specifically, a relay 408 selectively connects and disconnects the drivers 402 and receivers 404 from continuity with the test connector. Another relay 410 establishes selective connection with the test connector and another path on the board 400; for example, with the PMU. It will further be appreciated that portions of the present invention control the relay control signals so as to dynamically configure the board 400 in the appropriate manner for carrying out the diagnostic functions of the present invention. Furthermore, although only one of each relay is illustrated in the drawing, it will be appreciated that there may be multiple relays. For example, there is a relay 408 for each of the sixteen driver/receiver 402/404 pairs.

In normal operation, the test connector is connected via cabling or otherwise to a device under test (DUT). Thus, signals generated by the drivers 402 ultimately drive inputs of components on a DUT board. Likewise, output signals from components on a DUT board are delivered via the test connector to the receivers 404. By controllably varying the output level of the drivers 402 and monitoring the input levels of receivers 404, functional operation of a DUT may be tested. In additional to verifying the functional operation of a DUT, testers may also verify whether the components on the DUT are operating in accordance with specified tolerance values or ranges. As previously described, however, this type of testing can produce false or inaccurate results if the components on the tester fail or otherwise go out of specified tolerance.

As previously discussed, there is a known method for measuring timing accuracy, which involves the use of external measurement equipment, such as an oscilloscope and timing generator, to collect accuracy data. While this method achieves a relatively high degree of accuracy, it requires a user to manually probe each channel for several different measurement sets. In high-volume manufacturing environments, this external measurement device method is unacceptable.

Accordingly, the present invention is provided for testing and determining whether certain tester components are out of tolerance. In accordance with the present invention, the tester is used to measure its own accuracy, and requires a much simpler DUT board and very little user interaction to take data. As will be appreciated, this method is a much better choice because it minimizes impact on the manufacturing environment and still provides adequate measurement accuracy.

Figure 5:
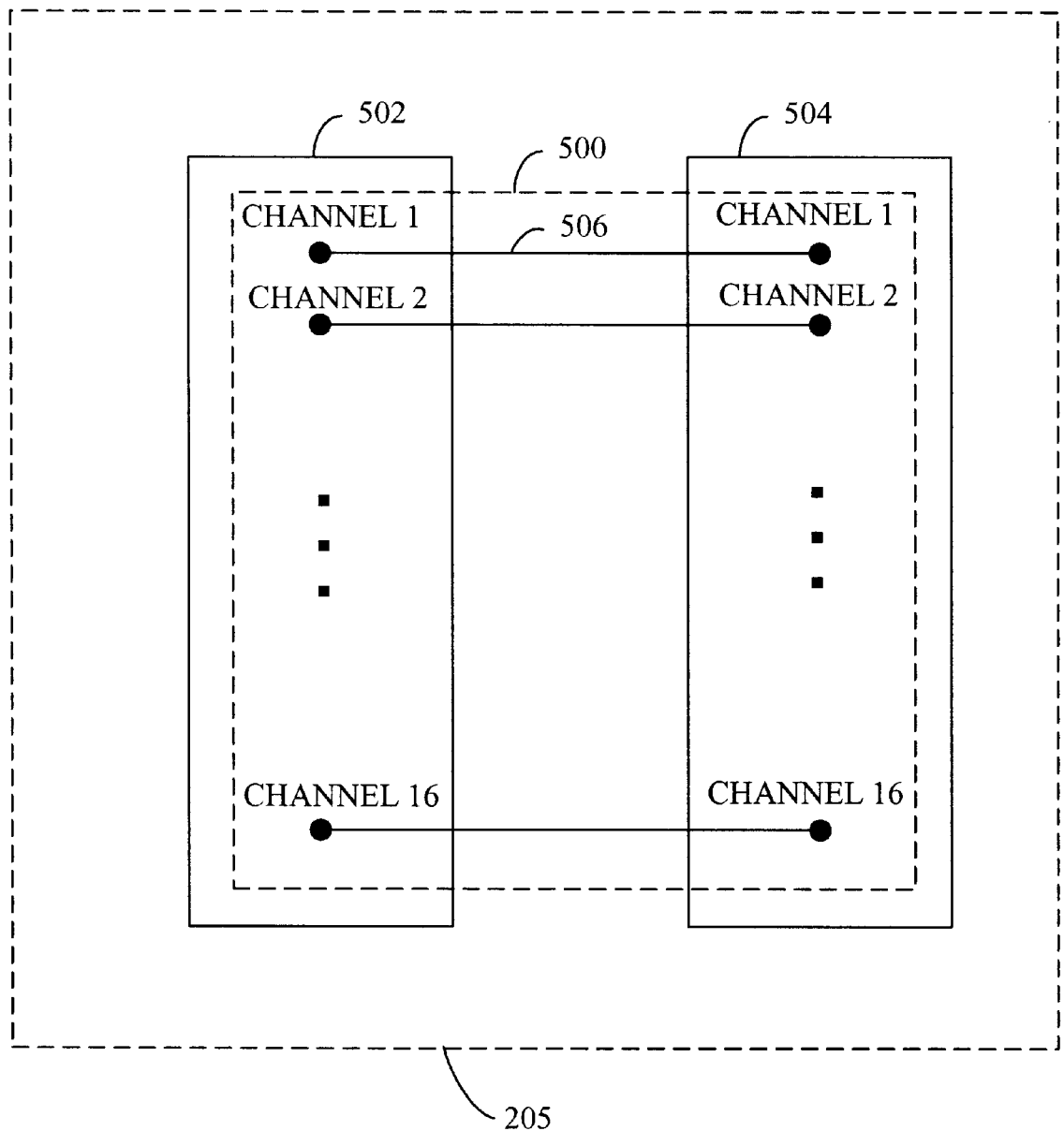
FIG. 5 is a block diagram illustrating the interconnection between pins of two test connectors of the test head of the testing device.

Referring briefly to FIG. 5, a specially-configured DUT board 500 is used in connection with the self tests performed by the preferred embodiment of the present invention. Specifically, this specialized DUT board 500 shorts pins from test connectors 502 and 504 together. As previously described, the tester includes a test head 205, through which all electrical connections with the tester are established. The test head 205 includes a plurality of connectors, such as test connectors 502 and 504. Channels 01 through 16 are illustrated on each of these test connectors 502 and 504. Channel 01 corresponds to a first driver/receiver 402/404 pair on the circuit board 400. The specially-configured DUT board 500 of the preferred embodiment contains conductive paths (e.g., 506) that short channel lines together between adjacent test connectors 502 and 504. In this way, a driver from a first circuit card 400 (for example, a card corresponding to test connector 502) may be connected to a receiver of a second circuit card (for example, a card corresponding to test connector 504). Of course, the preferred embodiment will control the relay control signals on the respective circuit boards 400 so as to effect the appropriate signal paths to establish this connection. In the preferred embodiment, all conductive paths (e.g., 506) on the DUT board 500 will be the same length.

Turning now to the specific concepts and teachings of the present invention, the timing metrology control tool of the preferred embodiment measures edge placement error. Edge placement error is the difference between the intended driver or comparator edge position and the actual position within a tester cycle. As will be appreciated, the edge placement error is composed of timing delay error, timing jitter, and transition time variation.

As is known and previously discussed, the traditional method of verifying edge placement accuracy is to use a more accurate tool to measure each edge's position and compare it to a standard edge in the system. For example, this may be performed using an external device, such as an oscilloscope, or some other tool with at least a 10:1 accuracy advantage. This method would be acceptable if the pin count were low. However, when testing a large number of pins with multiple edges (and particularly in a high volume environment), a more efficient method is desired.

Because of the large number of edges that generally need to be measured, and although not necessary for carrying out the inventive aspects, probability and statistics may be used to determine the accuracy of testers and tester components. As described below, a robust analysis routine may be used to gather large numbers of measurements automatically using both shorted board and open circuit tests.

Figure 6:
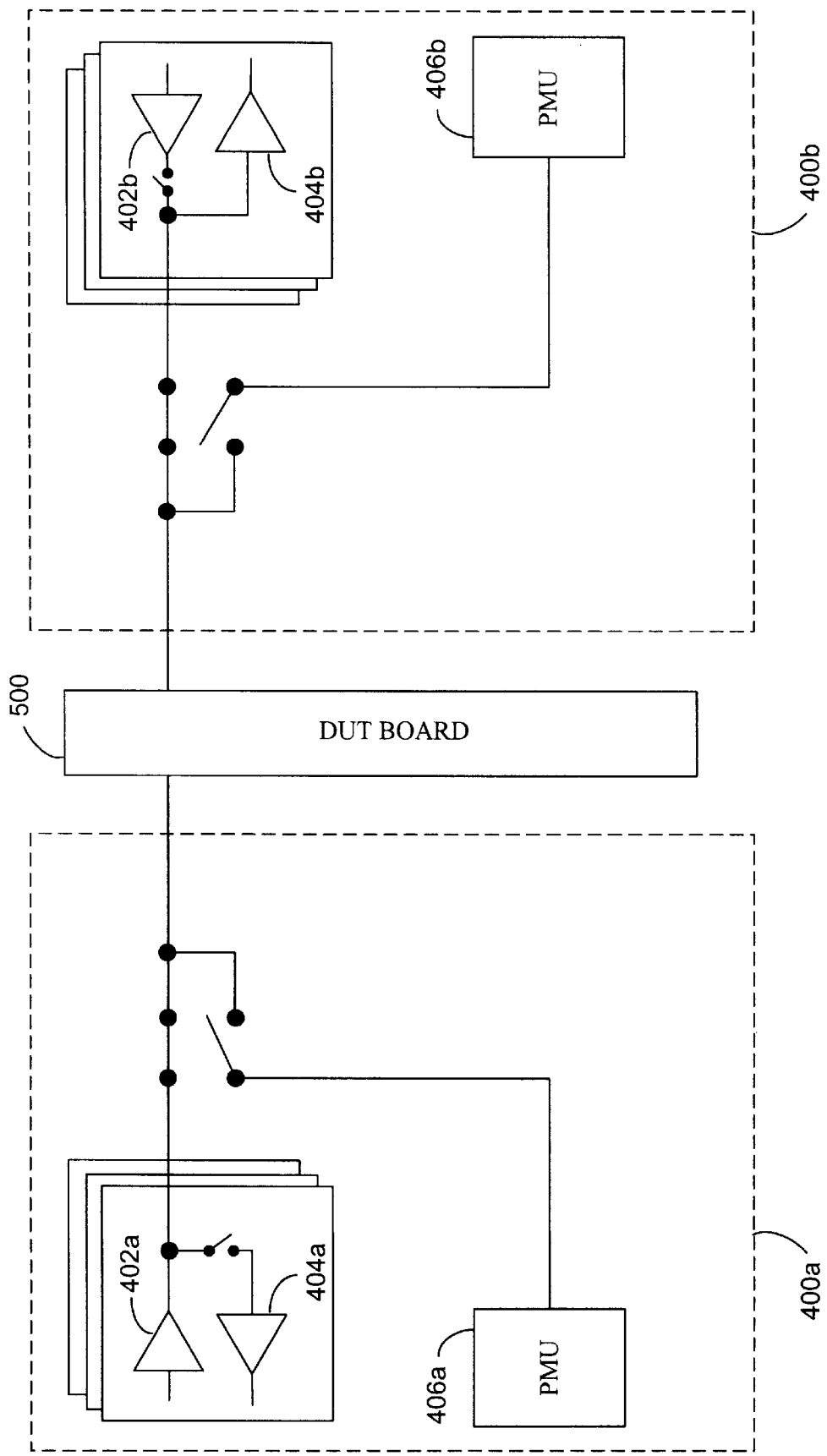
FIG. 6 is a block diagram illustrating the configuration of two circuit boards of the type illustrated in FIG. 4, configured to take a shorted board measurement.

The shorted board uses a DUT board 500 as described in connection with FIG. 5. When placed in the system, the configuration appears as shown in FIG. 6. Although not specifically described herein, the various relays of the circuit boards are controlled to move to the positions illustrated in FIG. 6. In this configuration, while the driver 402s drives a high, the receiver 404b performs a propagation delay functional test. According to this test, when the receiver 404b locates the driven pulse, the system records its time of arrival. In one implementation on the HP83000, this test is repeated thirty six times to account for all combinations of six drive edges and six receiver edges (there being six edges per tester cycle).

Preferably, conductive trace lengths on the shorted board 500 are substantially the same length for all pairs of pins so that comparative/differential propagation delay may be measured. If the testers were perfect, the recorded values for all pairs of pins would be the same. After the test is complete in one direction, the pins change functions and the whole process is repeated. That is, driver 402b is configured to drive receiver 402a. At the completion of the tests, both drive and receive data have been gathered for all pins.

Another test that is performed by the preferred embodiment of the present invention is referred to as the time domain reflectometer (TDR) measurement. Unlike the test described above, this test is performed without the shorting board 500 on the test head. As a result, each pin drives a one, with edge 1, to an open. That is, since no connection, and thus no load, is associated with the pins of the test head, 100% of the signal is reflected back toward the driver/receiver 402/404 pair (see FIG. 4). The time it takes the reflected signal to return to the receiver 404 is measured using the other five timing edges of the cycle. The TDR measurements are repeated several times to find both rise time and cable length plus the error offset for edge one of each pin.

Figure 7:
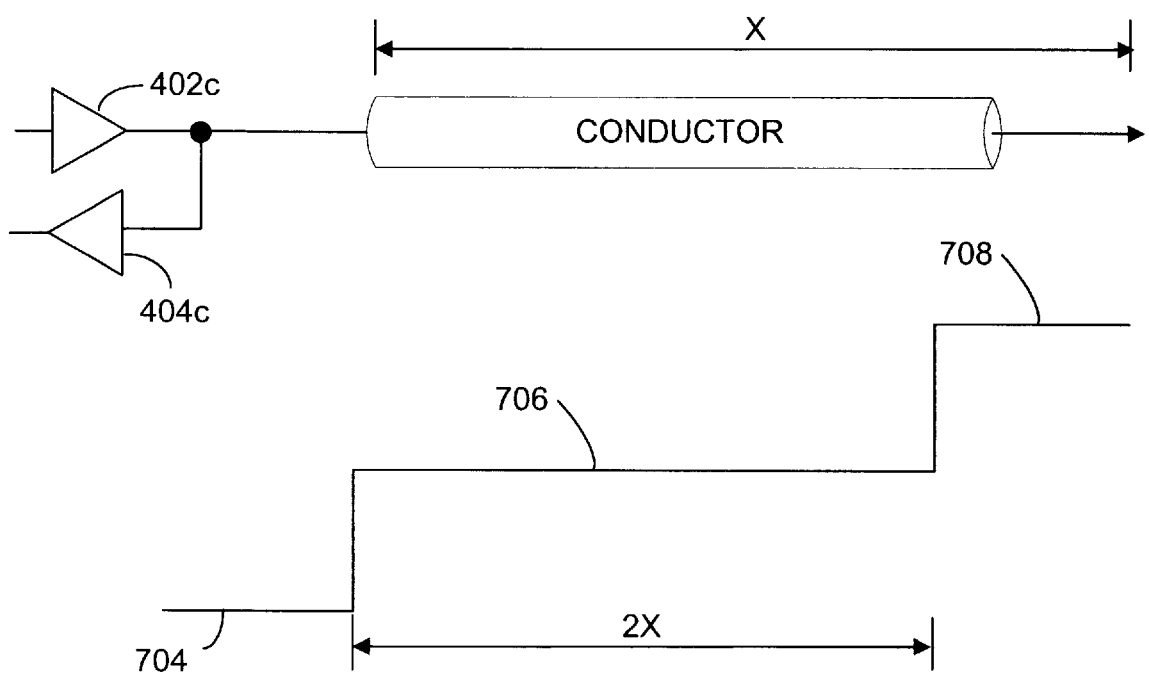
FIG. 7 is a schematic diagram illustrating the TDR test measurement.

FIG. 7 illustrates the TDR test measurement setup (both circuit and waveform). As shown, the driver 402 drives a signal along conductor 702. The drive signal, as observed by receiver 404, steps from 704 to 706 when placed on the cable 702. Preferable the drive signal is placed on the cable 702 at edge one (of the six edges in the HP83000). When the drive signal reaches the non-loaded end (i.e., the pin) of the cable 702 it is reflected back, and therefore doubles in amplitude 708 (as additive to the driven pulse). The distance or time between the two signal steps is directly proportional to the distance or length of the conductor 702.

Having briefly described the two measurement tests that are made, measurement theories are now discussed. Specifically, probability and statistics can be used to monitor the repeatability and accuracy of the testers, by making some assumptions,. The assumptions are:

1. Timing errors will be symmetrically distributed around zero error, so that the average measured value will be very close to the actual or correct value;
2. By taking the average value of a system and comparing it to a pin value plus or minus the acceptable error for that system, it can be determined if a pin is within the manufacturer's specification;

3. By comparing the average, upper, and lower measured times of all systems together, the repeatability of the test platform can also be determined; and 4. No pair of pins will be completely out-of-specification in opposite directions, making the sum of their offset error close to zero. As a result, if a pin has all six edges more than twice the specification limits out of specification, then the six edges on its companion pin will not be out the same amount in the opposite direction. By doubling the acceptable error, because of two pins used in the measurements, and using the above assumptions, the accuracy of a pair of pins can be tracked and monitored. One method for finding the error of each pin will be discussed below.

Once the data has been gathered, it needs to be processed to determine the repeatability and accuracy of the testers. From the three previous measurements, four different parameters may be calculated. The parameters are rise time, TDR, drive error, and receiver 404 error, each of which are discussed below.

Rise time measurements

Since the rise time measurements are taken with a TDR, the waveforms can have a step (as illustrated in FIG. 7). This step is not a function of the rise time but a function of the reflected edge. To get around the step problem, the rise time is measured two times, once at 10–40% and the next at 60–90%. The number recorded for each pin is the average of these two numbers in Volts/nanosecond.

TDR measurements

The TDR test measures the delay or length of the transmission line from the driver 402 to the end of the line and back to the receiver 404 (See FIG. 7). Since the TDR measurement is performed without a shorting board 500 or other load, the driver 402 drives the signal into an open and 100% of the drive signal is reflected at the tip of the pogo pin (i.e., the pin at the connector). The time recorded (Tdr) by the TDR test is:

$$Tdr = \text{actual transmission time} - \text{calibration offset} \tag{1}$$

If the calibration offset for a pin or edge is correct, then the recorded value (Tdr) should be zero. However, this is rarely the case. The following can be substituted for Equation 1.

$$Tdr = \Delta D - \Delta C \tag{2}$$

Where: Tdr=Measure time
ΔD=Driver edge error
ΔC=Receiver edge error

If the assumption is made that the driver error and receiver error for a given pin and edge, are equal in magnitude, then:

$$|\Delta D| = |\Delta C| \tag{3}$$

Based on the above Equation 2 can be solved for ΔD and ΔC:

$$\Delta D = Tdr/2 \quad \Delta C = -Tdr/2 \tag{4}$$

If driving with edge one while receiving with the other 5 edges, 2X transmission error or 4X the drive error of edge one can be found. By taking the average of five receiver edges, most of the error caused by jitter is averaged out of the measurement.

Shorted board measurements

The shorted board measurements give only an overall view of the system. This is because an inaccurate driver 402 drives a signal into an inaccurate receiver 404. A look at this test by itself can only give an accuracy for any one pin of +/−2X the accuracy of the tester. Therefore, the shorted board test typically identifies significant problems. However, with multiple measurements of a set of pins, the shorted board data may be processed to find the error of edges two through six with respect to edge one. This is done for each driver 402 and receiver 404 separately. Starting with the following equation of the time(t) measured in the shorted board test:

$$t = d - c \tag{5}$$

Where:

$$d = D + \Delta D \tag{6}$$

$$c = C + \Delta \tag{7}$$

And: t=Measured value using shorted board.
D=Correct Drive time
ΔD=Driver error
C=Correct Receiver time
ΔC=Receiver error ΔD and ΔC have a mean zero for all pins added together and a variance of σd and σc. The data taken from the testers also shows ΔD and ΔC are normally distributed around zero.

$$t = d - c = D + \Delta D - (C + \Delta C) = D - C + \Delta D - \Delta C \tag{8}$$

The expected value in a fully calibrated system would be: t=D−C.
The variance of the system is:

$$Variance(t) = \text{var}\{(D-C) + (\Delta D - \Delta C)\} \tag{9}$$

$$= \sigma d^2 + \sigma c^2 - 2\,Cov(\Delta D - \Delta C) \tag{10}$$

Since the edge errors are all independent, the covariance is equal to zero. Thus, 2Cov(ΔD−ΔC).

By defining l as the driver's edge number and m as the receiver's edge number on a pair of pins, Equation 8 becomes:

$$t_{lm} = d_l - c_m = D^l + \Delta D_l (C_m + \Delta C_m) \tag{11}$$

Equation 10 becomes:

$$\sigma^2_{\Sigma t lm} = \sigma d_l^2 + \sigma c_m^2 \tag{12}$$

Using Equation 8 we get the following:

$$t_{11} - t_{12} = D_1 + \Delta D_1 - (C_1 + \Delta C_1) - [D_1 + \Delta D_1 - (C_2 + \Delta C_2)] \tag{13}$$

$$t_{11} - t_{13} = D_1 + \Delta D_1 - (C_1 + \Delta C_1) - [D_1 + \Delta D_1 - (C_3 + \Delta C_3)]$$

$$\vdots$$

$$t_{11} - t_{16} = D_1 + \Delta D_1 - (C_1 + \Delta C_1) - [D_1 + \Delta D_1 - (C_6 + \Delta C_6)]$$

or $$t_{11} - t_{1m} = D_1 + \Delta D_1 - (C_1 + \Delta C_1) - [D_1 + \Delta D_1 - (C_m + \Delta C_m)]$$

These equations are for the six edges on the HP83000. Both D and C are constants in these equations. By solving for drive edge error and receiver edge error separately, the following equations are obtained:

$$t_{12} - t_{11} = \Delta C_2 - \Delta C_1 \qquad t_{21} - t_{11} = \Delta D_1 - \Delta D_2$$
$$t_{13} - t_{11} = \Delta C_3 - \Delta C_1 \qquad t_{31} - t_{11} = \Delta D_1 - \Delta D_3$$
$$\vdots \qquad \text{and} \qquad \vdots$$
$$t_{16} - t_{11} = \Delta C_6 - \Delta C_1 \qquad t_{61} - t_{11} = \Delta D_1 - \Delta D_6$$

Here, there are ten equations and twelve unknowns. From the ten equations, the following two equations are obtained.

$$t_{1m} - t_{11} = \Delta C_m - \Delta C_1 \tag{14}$$

and $$t_{n1} - t_{11} = \Delta D_1 - \Delta D_n \tag{15}$$

At this point, the amount of error for edges two through six can be found with respect to edge one. Now, a way of referencing edge one of all the pins to each other is needed. By using Equation 4 from the TDR measurement to find edge one, and substituting it into Equations 14 and 15, the following is obtained:

$$\Delta C_m = t_{1m} - t_{11} - Tdr/2 \tag{16}$$

and $$\Delta D_n = t_{11} - t_{n1} + Tdr/2 \tag{17}$$

These equations do not take into account the jitter from the receiver's measurements. However, by averaging the six measurements for each edge on the shorted board test, and five measurements for edge one on the TDR test, almost all error caused by jitter is removed.

The driver error and receiver error can be found separately for each edge, by using Equations 16 and 17. With these equations the need to double the manufacturer's specifications is not needed. This test can now ensure the ability of testers to meet the manufacturer's specifications on a pin by pin, edge by edge basis.

Standard Equations

By using the above measurement methods and assumptions, the testers can be monitored in many different ways, all of which help track problems and control edge placement accuracy of the testers. For all five types of data taken, four data points may be calculated and tracked in a statistical data base. By charting these four data points, each system can be tracked and compared with each other. If one system differs from the others in any of the charted areas, then it will show up in one of these charts. For each set of measurements or calculations taken, the four types of statistics charted are the average, standard deviation, minimum value and maximum value.

The statistical charts, along with equipment specifications, may be used to set limits for each measurement. Each time the test programs are run the results are checked against these limits. If data points are found outside of these limits, the test fails and a message is sent to a display. In addition, information covering the test type, pin number, and amount of error may be sent to a file for use in calibrating or repairing the tester.

The TDR, rise time, and shorted board measurements can also be used in troubleshooting the HP83000 by logging the average offset value of each pin. This is done by averaging the driver 402 and receiver 404 offset errors for each pin. The data may be logged to a local file on each system. The last six entries for each pin may be checked for the following statistical valuations:

1. standard deviation greater than 20 picoseconds;
2. last data point outside of the range formed by the average +/- the pin's standard deviation; and
3. a trend, plus or minus, of greater than 20 picoseconds If any of these conditions are met, the information is reported to the user.

Figure 8:
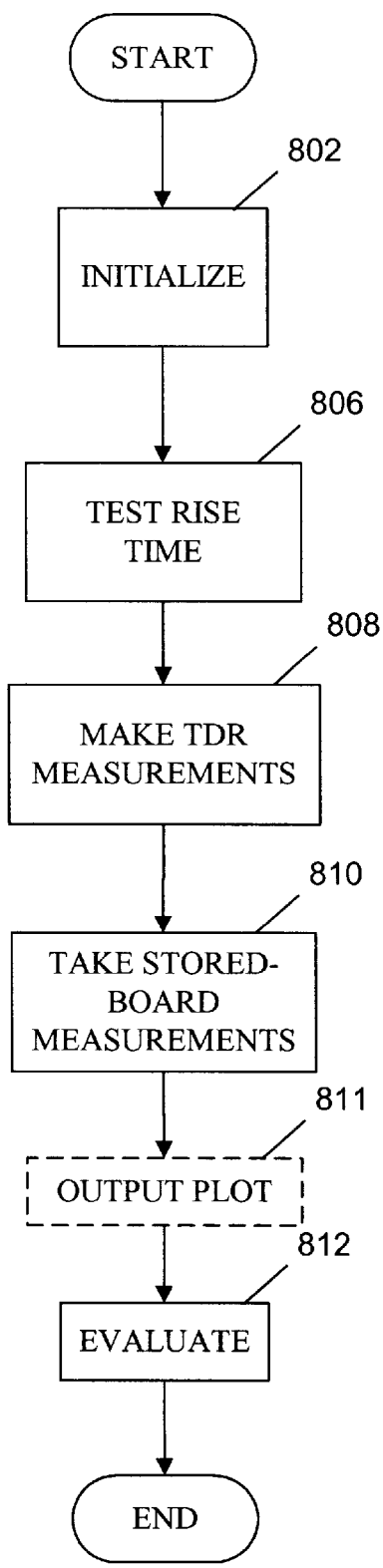
FIG. 8 is an operational flowchart illustrating the principal steps in testing and measuring in accordance with one embodiment of the invention.

Reference is made briefly to FIG. 8, which shows a flowchart of the principal operational steps in a preferred embodiment of the present invention. Specifically, upon start-up the method may perform an initialization routine 802, which includes initializing variables and performing a variety of initial configuration tasks, which will necessarily vary from tester to tester and implementation to implementation, and therefore need not be discussed herein. After initialization, the method may determine and configure the various tester channels for performing the various tests. Then, the tester performs the various tests, including rise time test (step 806), TDR test (808), and shorted-board tests (810).

Figure 9:
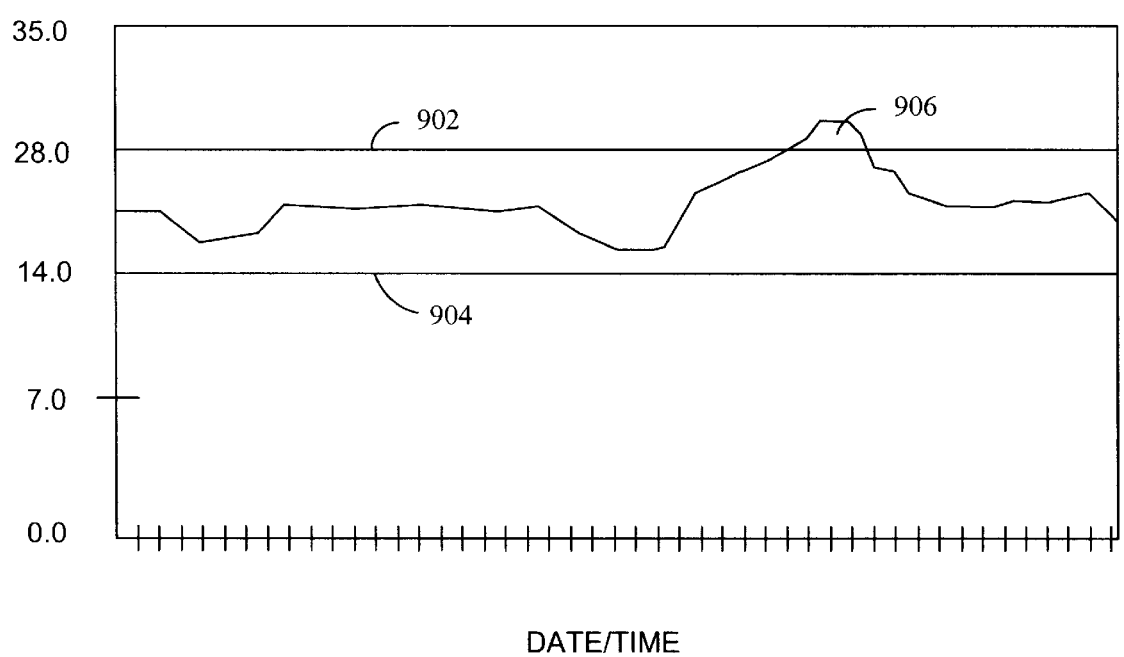
FIG. 9 is a graph illustrating a graphical plot that may be generated by the preferred embodiment of the present invention.

In the preferred embodiment, a routine may be provided to generate a graphical output illustrating this test results (Step 811). Such a graphical output may appear similar to that shown in FIG. 9. In this regard, a vertical dimension of the graph may correspond to the standard deviation of a TDR test, and the horizontal dimension may represent a data, time, or test number. In the illustrated graph, horizontal lines 902 and 904 represent the permissible tolerance or deviation ranges. Accordingly, area 906 of the graph represents a failed condition, or at least test(s) where the driver did not perform within specified tolerance.

Finally, at step 812 the method evaluates the results to determine whether the drivers 402 and receivers 404 are within a specified tolerance or not.

The foregoing description has been presented for purposes of illustration and description. It is not intended to be exhaustive or to limit the invention to the precise forms disclosed. Obvious modifications or variations are possible in light of the above teachings. The embodiment or embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. An apparatus for testing component tolerance of a device for testing integrated circuits, the device having a plurality of test connectors disposed at a test head, each test connector having electrical conductors carrying electrical signals for a test channel, wherein each test channel corresponds to a circuit board that includes at least one driver and one receiver, the system comprising:

shorting means for establishing a low impedance electrical connection between electrical conductors of a first and second test connector, such that a first driver from a first circuit board is electrically connected across a low impedance path to a first receiver on a second circuit board;

a controller configured to control the first driver to output an electrical signal at a predetermined time;

evaluating means designed to detect the signal received at the first receiver; and timing means configured to time a signal delay from the time that the first driver outputs an electrical signal to the time that the evaluating means detects the received signal.

2. The apparatus as defined in claim 1, wherein the shorting means includes a printed circuit board containing metal layers that establish direct conductive paths between pins on the first test connector to pins on the second test connector.

3. The apparatus as defined in claim 1, wherein the evaluating means and the timing means are realized through program code that controls the operation of a processing unit.

4. The apparatus as defined in claim 3, wherein the processing unit is a device selected from the group consisting of: a microprocessor, a microcontroller, an embedded controller, an application specific integrated circuit, and dedicated hardware specially designed to carry-out processing and control functions.

5. The apparatus as defined in claim 1, wherein the controller is configured to output the electrical signal coincident with one of a plurality of edges, which plurality of edges are periodically disposed within a period of a master clock cycle of the apparatus.

6. The apparatus as defined in claim 1, wherein the timing means is configured to measure the time when a signal arrives at the interface between a device under test (DUT) board and the tester within a tester cycle.

7. The apparatus as defined in claim 1, further including means for performing a statistical analysis of timing test results, wherein the timing test results are generated from executing a timing test a plurality of times.

8. In a testing device for testing integrated circuits having a plurality of test connectors disposed at a test head, each test connector having electrical conductors carrying electrical signals for a test channel, wherein each test channel corresponds to a circuit board that includes at least one driver and one receiver, a method for diagnosing component timing variances comprising the steps of:

establishing an electrical connection between electrical conductors of a first and second test connector such that a first driver from a first circuit board is electrically connected across a low impedance path to a first receiver on a second circuit board;

controlling the output of the first driver to drive an edge of an electrical signal at a predetermined time;

detecting the signal received at the first receiver; and determining that the signal received at the first receiver is within a predetermined time period of the predetermined signal level output from the first driver.

9. The method as defined in claim 8, further including the steps of:

establishing an electrical connection between electrical conductors of a first and second test connector such that a second driver from a second circuit board is electrically connected across a low impedance path to a second receiver on a first circuit board;

controlling the output of the second driver to drive an electrical signal at a predetermined time;

detecting the signal received at the second receiver; and determining that the signal received at the second receiver is within a predetermined time period of the predetermined signal output from the second driver.

10. The method as defined in claim 8, wherein the step of establishing an electrical connection further comprises establishing an electrical connection between electrical conductors of a first and second test connector such that a plurality of drivers from a first circuit board are electrically connected across low impedance paths to a plurality of receivers on a second circuit board, wherein each of the plurality of drivers is known to be within a specified tolerance.

11. The method as defined in claim 8, further including the steps of:

repeating the controlling, detecting, and determining steps a plurality of times to obtain a plurality of measurements; and performing a statistical analysis on the plurality of measurements to determine whether components are within a specified accuracy.

12. In a testing device for testing integrated circuits having a plurality of test connectors disposed at a test head, each test connector having electrical conductors carrying electrical signals for a test channel, wherein each test channel corresponds to a circuit board that includes at least one driver and one receiver, a method for diagnosing component variances comprising the steps of:

establishing an electrical connection between electrical conductors of a first and second test connector such that at a first driver from a first circuit board is electrically connected across a low impedance path to a first receiver on a second circuit board;

delivering a control signal to the first driver to drive an output signal at a predetermined time;

detecting the signal received at the first receiver; and verifying that the signal received at the first receiver is received within a predetermined time of the signal output from the first driver.

13. The method as defined in claim 12, further including the steps of:

establishing an electrical connection between electrical conductors of a first and second test connector such that a second driver from a second circuit board is electrically connected across a low impedance path to a second receiver on a first circuit board;

delivering a control signal to the second driver to drive an output signal at a predetermined time;

detecting the signal received at the second receiver; and verifying that the signal received at the second receiver is received within a predetermined time of the signal output from the first driver.

14. The method as defined in claim 12, wherein the step of establishing an electrical connection further comprises establishing an electrical connection between electrical conductors of a first and second test connector such that a plurality of drivers from a first circuit board are electrically connected across low impedance paths to a plurality of receivers on a second circuit board, wherein each of the plurality of receivers is known to be within a specified tolerance.

15. A computer readable storage medium containing program code for controlling the operation of a self test for an automatic testing device, comprising:

a first code segment that contains program code that controls the output of a first driver on a first circuit board to drive an electrical signal at a predetermined time;

a second code segment that contains program code that evaluates the signal timing received at a first receiver disposed on a second circuit board, that is configured to receive the signal output by the first driver; and a third code segment that contains program code that verifies that the signal timing received at the first receiver is within a predetermined tolerance of an allowable error of the driver and receiver of the first driver and first receiver.

16. In a testing device for testing integrated circuits having a plurality of test connectors disposed at a test head, each test connector having electrical conductors carrying electrical signals for a test channel, wherein each test channel corresponds to a circuit board that includes at least one driver and one receiver, a method for diagnosing component variances comprising the steps of:

- disposing a first test connector in an open, no-load configuration to obtain maximum impedance mismatch from a characteristic line impedance and thus obtain maximum signal reflection;
- controlling a first driver to drive an output signal at a predetermined time;
- detecting a reflected signal at a first receiver, the first receiver being disposed on the same circuit board as the first driver; and
- verifying that the signal received at the first receiver is received within a predetermined time of the signal output from the first driver.

17. The method of claim 16, further including the steps of:

- repeating the controlling, detecting, and verifying steps a plurality of times to obtain a plurality of measurements; and
- performing a statistical analysis on the plurality of measurements to determine whether components are within a specified accuracy.

18. An apparatus for testing component tolerance of a device for testing integrated circuits, the device having a plurality of test connectors disposed at a test head, each test connector having electrical conductors carrying electrical signals for a test channel, wherein each test channel corresponds to a circuit board that includes at least one driver and one receiver, the system comprising:

- a controller configured to control a first driver on a first circuit board to output an electrical signal at a predetermined time;
- evaluating means designed to detect a reflection of the electrical signal received at a first receiver on the first circuit board, wherein the test connector corresponding to the first circuit board is disposed in a no-load configuration so that maximum signal reflection is achieved;
- timing means configured to time a signal delay from the time that the first driver outputs an electrical signal to the time that the evaluating means detects the received signal; and
- verifying means responsive to the timing means for verifying that the reflected signal is received within an predetermined time.

19. The apparatus of claim 18, wherein the first driver and first receiver are disposed in close proximity to each other.

20. The apparatus of claim 18, wherein the distance of a conductive path extending between the first driver and the test connector is substantially the same as the path extending between the first receiver and the test connector.

* * * * *